United States Patent
Doany et al.

[11] Patent Number: 5,314,709
[45] Date of Patent: May 24, 1994

[54] UNZIPPABLE POLYMER MASK FOR SCREENING OPERATIONS

[75] Inventors: Fuad E. Doany, Katonah; Gary W. Grube, Washingtonville; Ravi Saraf, Briarcliff Manor, all of N.Y.

[73] Assignee: International Business Machines Corporation, Armonk, N.Y.

[21] Appl. No.: 672,248

[22] Filed: Mar. 20, 1991

[51] Int. Cl.$^5$ .............................. H01L 21/00
[52] U.S. Cl. ........................ 427/96; 427/266; 427/555; 427/558; 156/643; 156/668; 156/659.1
[58] Field of Search ............ 156/643, 668, 645, 659.1; 427/54.1, 43.1, 96, 264, 265, 266

[56] References Cited

U.S. PATENT DOCUMENTS

| | | | |
|---|---|---|---|
| 4,456,675 | 6/1984 | Anderson, Jr. et al. | 156/643 |
| 4,508,754 | 4/1985 | Stepan | 427/53.1 |
| 4,539,222 | 9/1985 | Anderson, Jr. et al. | 427/43.1 |
| 4,842,677 | 6/1989 | Wojnarowski et al. | 427/53.1 |
| 4,865,873 | 9/1989 | Cole, Jr. et al. | 427/53.1 |
| 4,987,211 | 1/1991 | Araps et al. | 526/251 |

Primary Examiner—Brian E. Hearn
Assistant Examiner—George Goudreau
Attorney, Agent, or Firm—Scully, Scott Murphy & Presser

[57] ABSTRACT

The present invention relates to a dry process for forming patterns on a substrate. More particularly, the process contemplates coating an unzippable polymer film with a small amount of desirable UV if required on a substrate; laser ablating said film into a desired pattern or mask; screening a conductive or resistive paste onto the substrate through the ablated features of said mask; heating said substrate and mask to the unzipping temperature of said mask; and, vaporizing said mask and UV absorbing dye if present leaving behind the solid of said conductive or resistive past adhered to the substrate in the desired pattern.

18 Claims, 6 Drawing Sheets

UNZIPPABLE POLYMER MASK FOR SCREENING OPERATIONS

BACKGROUND OF THE INVENTION

1. Field of the Invention

The present invention relates to a dry process for forming patterns on a substrate, wherein an unzippable polymer is employed as a screen to increase screening resolution in both lateral and thickness dimensions.

In a preferred embodiment, a suitable unzippable polymer, with or without a UV absorbing dye, is solution cast or spin coated on a substrate. The unzippable polymer is then laser ablated to form the desired pattern. A paste is then screened through the ablated polymeric pattern onto the substrate. After coating paste deposition, the sample is heated to depolymerize the unzippable polymer thereby destroying the adhesion of the unzippable polymer to the substrate; and, the unzippable polymer volatilizes off the substrate leaving behind the coating paste adhered to the substrate in the ablated pattern.

2. Description of the Prior Art

U.S. Pat. No. 4,508,754 to Stepan discloses a method for adding fine line conductive/resistive patterns to a thick film microcircuit. More particularly, the method comprises cutting a circuit pattern on a substrate; filling the circuit pattern with a conductive or resistive paste and removing the excess; adding screen printing thick film circuit elements on the substrate surface and over selected portions of the fine line pattern; and heating, thereby sintering the paste and thick film elements to the substrate.

U.S. Pat. No. 4,456,675 to Anderson, Jr., et al. relates to a dry process for forming metal patterns wherein metal is deposited on a depolymerizable polymer and selectively removed. The process comprises forming a mask of a thermally depolymerizable polymer at a temperature above 350° C. on a substrate with a pattern of openings complementary to the desired metal pattern; blanket coating the substrate and the mask with a metal; heating the substrate to depolymerize the depolymerizable polymer; cooling the surface of the metal to thereby delaminate the metal coated in the areas where the thermally depolymerizable polymer is present; removing the delaminated metal where necessary, and optionally plasma ashing the depolymerized polymer, if residue thereof remains, to remove same from said substrate.

U.S. Pat. No. 4,539,222 to Anderson, Jr., et al. discloses a wet process for forming a desired metal pattern on a substrate which comprises forming a mask of a thermally depolymerizable polymer on the substrate with a pattern of openings corresponding to the desired metal pattern; blanket coating the substrate and the mask with a metal; heating to depolymerize the thermally depolymerizable polymer, and removing the thermally depolymerizable polymer and metal thereover in a mild solvent.

U.S. Pat. No. 4,842,677 to Wojnarowski, et al. relates to a dual layer photoresist system which is applicable to the formation of high resolution conductive patterns on insulative substrates with non-planar surface variations. The method comprises disposing a thin layer of ablatable photoabsorptive polymer on a substrate containing a conductive layer; directing a beam of laser energy on the ablatable polymer through a mask so as to ablate the polymer layer partly exposing the conductive layer; disposing a thick layer of substantially transparent material over the partially ablated polymer layer and partially exposed conductive layer wherein the photoabsorptivity and transparency are determined with respect to the same frequency range; and directing a beam of laser energy through the thick layer so as to ablate the polymer layer and to simultaneously remove the thick layer above the ablated polymer layer, whereby select portions of the conductive layer are exposed.

U.S. Pat. No. 4,865,873 to Cole, Jr., et al. discloses a method of electrolessly plating a metal on a substrate. The method comprises coating the substrate with at least one layer of an ablatively-removable material; irradiating at least a portion of the coated layer with a sufficient amount of laser radiation to ablatively remove the irradiated portions of the coated layer; coating the irradiated substrate with a catalyst capable of instigating the electroless deposition of a metal to be plated when contacted with an electroless plating solution; and contacting the catalyst coated substrate with an electroless plating solution to plate the metal on the irradiated portion of the substrate, and, remove the unirradiated catalyst-coated layer.

The method of the present invention obviates many of the disadvantages inherent in prior art processes. More specifically, the present invention does not employ currently used wet procedures, which include a solvent exposure, to remove organic masking layers. This prior art technique can lead to device solvent contamination and adhesion loss with polymer containing devices and structures. Rather, the present process employs a laser ablatable unzippable polymer as a masking layer, which is thermally depolymerizable and does not require solvent exposure to effect lift-off.

For instance, many prior art wet procedures employ a lift-off layer comprising a polysulfone. This lift-off layer is typically removed by soaking in hot N-methyl pyrrolidine (NMP) for about 8 to about 18 hours at elevated temperatures, i.e., 85° C.–130° C. The solvent dissolves the polysulfone layer and the overlaying metal film leaving behind the desired metallization pattern. Typical disadvantages inherent with this technique include long soak times in hot NMP; strong polar solvents such as NMP readily swell organic polymers such as polyimides which results in increased volumn of the organic polymers which can stress and crack the barrier layers; NMP is readily absorbed into organic polymers and are extremely difficult to remove from the device; and, polysulfone is sensitive to electron beam radiation which apparently leads to cross linking, resulting in reduced solubility and longer NMP soak times to effect lift-off.

SUMMARY OF THE INVENTION

The present invention relates to a dry process for forming patterns on a substrate. More specifically, a depolymerizable, unzippable mask with or without a UV absorbing dye is employed as a screen to increase the screening resolution in both lateral and thickness dimensions.

The present invention specifically provides for selective removal of the unzippable polymer mask from the substrate without recourse to solvent exposure.

DETAILED DESCRIPTION OF THE INVENTION

Figure 1:
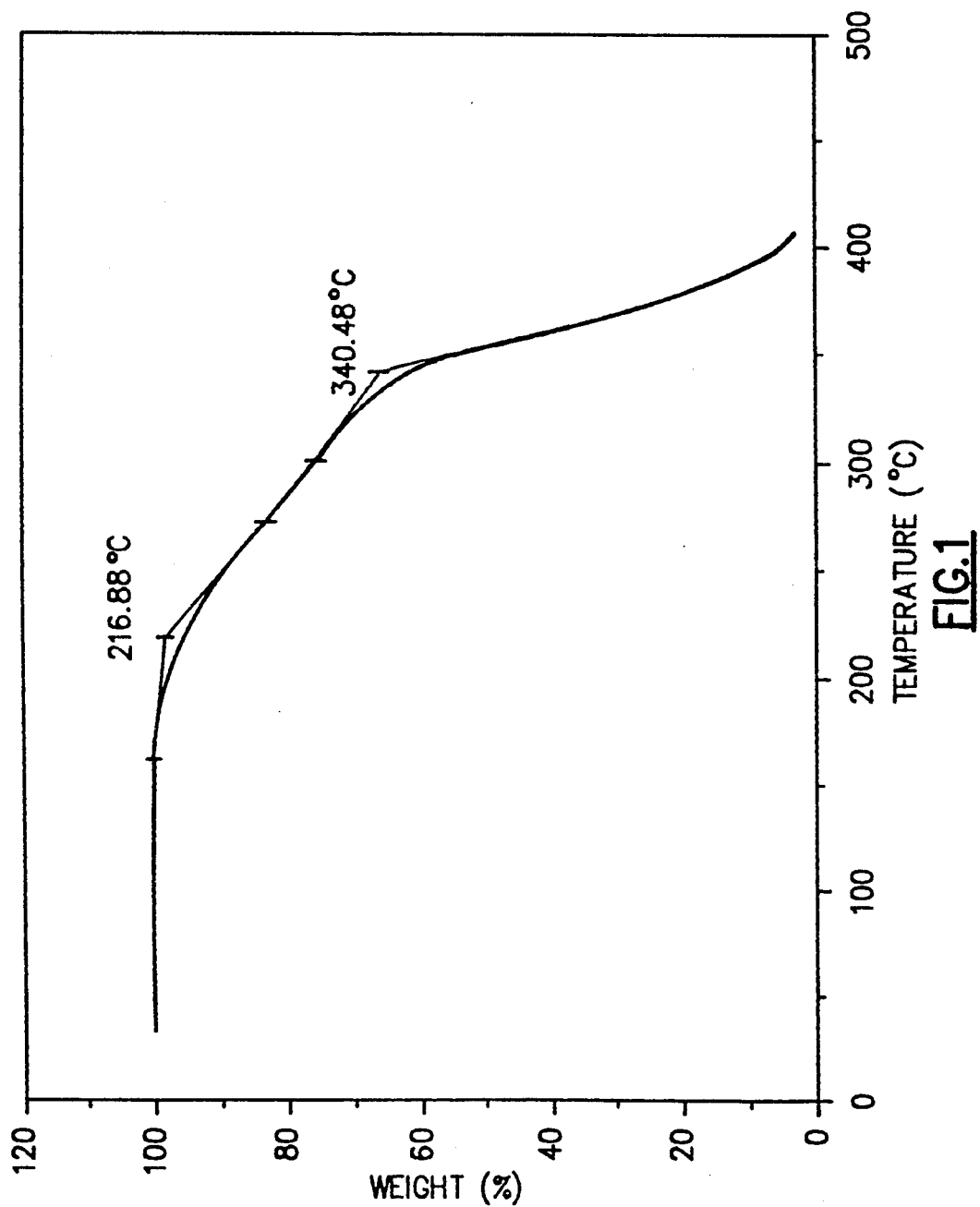
FIG. 1 is a graphical illustration of the unzipping temperature (T $_{unzipping}$) of poly(alpha methylstyrene).

The present invention relates to a dry process for screening operations which employs an unzippable polymer mask. More specifically, the process of the present invention comprises:

(a) casting a film of at least one unzippable polymer, which may be admixed with a UV absorbing dye, on a selected substrate;

(b) laser ablating said unzippable film into the desired pattern to form a mask;

(c) screening the desired paste, for e.g., a conductive or resistive paste through the ablated features of the mask and onto the substrate;

(d) heating the unzippable mask to the unzipping temperature ($T_{unzipping}$) to thermally depolymerize the unzippable polymer and vaporize the UV absorbing dye if present; and (e) removing the paste debris by conventional processes such as air blowing, electrostatic cleaning, etc., leaving behind the desired pattern of coating paste on the substrate.

The substrates suitable for use in the present process must permit initial adhesion of the unzippable polymer thereto and the thermal depolymerization of the unzippable polymer without being adversely affected.

The substrates employable in the process of the present invention typically comprise a SC substrate as is used in semiconductor and packaging manufacture. Hereafter, when the term "SC substrate" is used, this refers to an inorganic substrate as employed in the semiconductor packaging arts. Such SC substrates typically possess a coefficient of thermal expansion on the order of 3 to $20 \times 10^{-6}/°C$. or less. Typical commercially used SC substrates for the manufacture of microelectronic devices and packaging structures include silicon, silicon nitride, ceramics such as $Al_2O_3$, glass-ceramics and the like.

As will be appreciated by one skilled in the art, in the context of the present invention the term substrate includes a layer or layers which, in fact, is/are formed on an underlying substrate per se, e.g., a layer such as silicon dioxide, silicon nitride and the like. It is well known that such materials serve a chemically passivating function in microelectronic devices and packaging structures.

The present invention is not only useful for application of patterning using the thermally depolymerizable layer on an inorganic substrate but is also useful in applications on an organic substrate such as a polyimide used as passivating or dielectric materials in a semiconductor device or packaging structure. Other useful substrate polymers include high temperature stable organic materials with low dielectric constants (<3.6) such as polyquinoxalines, polyphenylenes, etc. Processing parameters are the same as for a device or packaging structure involving only inorganic materials.

The most preferred unzippable polymers possess the following characteristics:

(1) the polymers should thermally unzip by regular scission of the main chain, resulting in the reversal of the polymerization process and regeneration of the gaseous monomer(s);

(2) thermal unzipping should not produce a residue;

(3) the polymer should not unzip and generate volatiles below a certain threshold temperature.

It should be noted that while most high powered excimer lasers operate in the UV range, unzippable polymers that do not absorb in the UV range can be employed in the present process. However, when employing unzippable polymers that do not absorb in the UV range, such as poly(olefin carbonates), and ablation is to be effected in the UV range, a UV absorbing dye is admixed with said unzippable polymer to impart ablatable properties to said polymer. The UV absorbing dye absorbs UV radiation and transfers the energy to the unzippable polymer to cause ablation. UV absorbing dyes employable in the present process should exhibit the following characteristics:

(1) the dye should absorb UV laser radiation at the wavelength of interest;

(2) the dye should cause, through the transfer of energy, the abalation of the unzippable polymer film upon exposure to UV radiation;

(3) the dye should subline at temperatures below the $T_{unzipping}$ of the polymer and above the screening temperature; and (4) the dye should be soluble in NMP and other organic solvent(s) employed to dissolve the unzippable polymer prior to casting said polymer on the substrate.

Tinuvin 328, manufactured by Ciba-Geigy is an example of a suitable UV absorbing dye. Typically, 3–10% of Tinuvin 328, which absorbs in the 300–360 nm range, can be admixed with non-UV absorbing unzippable polymer, such as a poly(olefin carbonate), to form an acceptable ablatable, unzippable polymer film.

Figure 2:
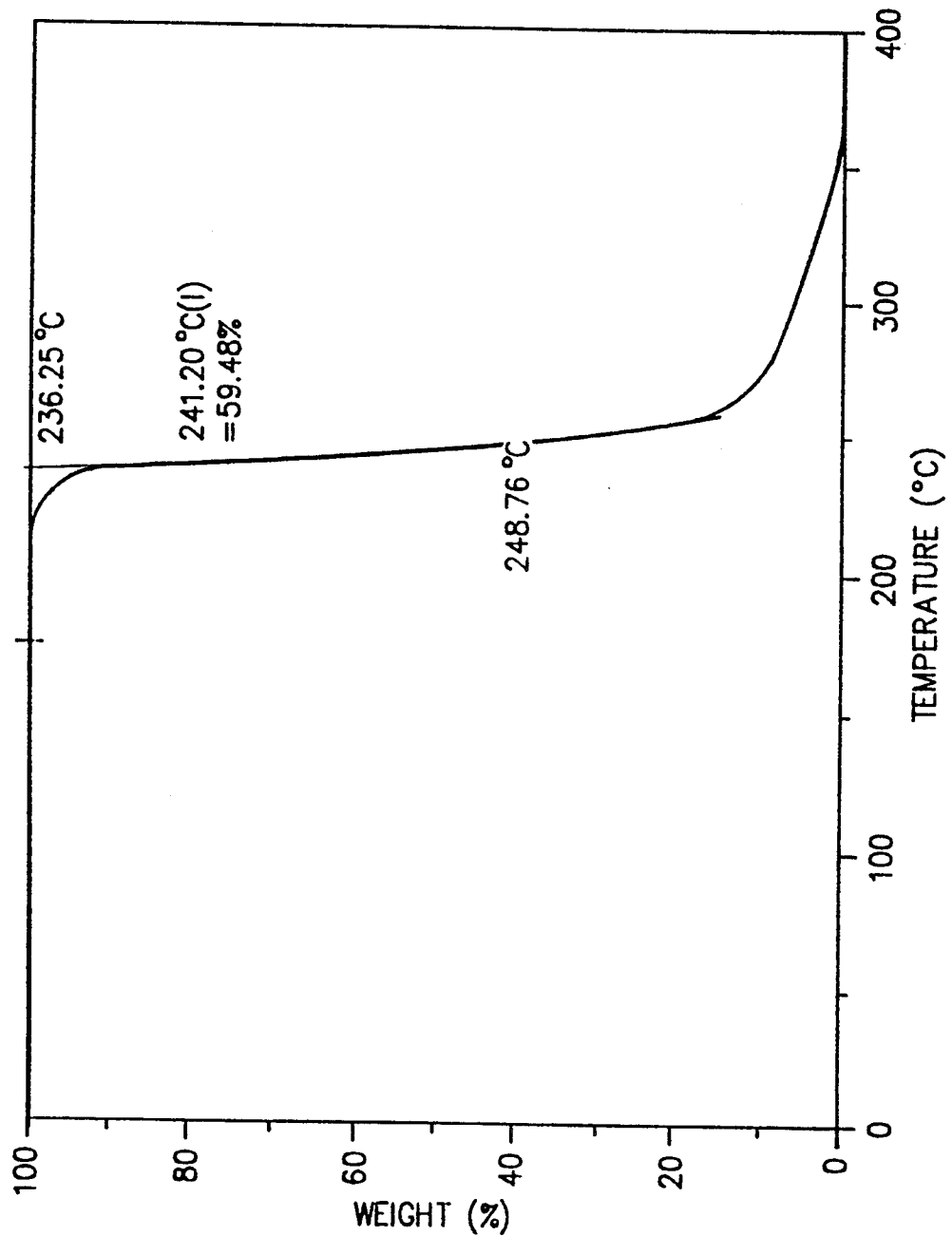
FIG. 2 is a graphical depiction of the unzipping temperature of poly(propylene carbonate).
Figure 3:
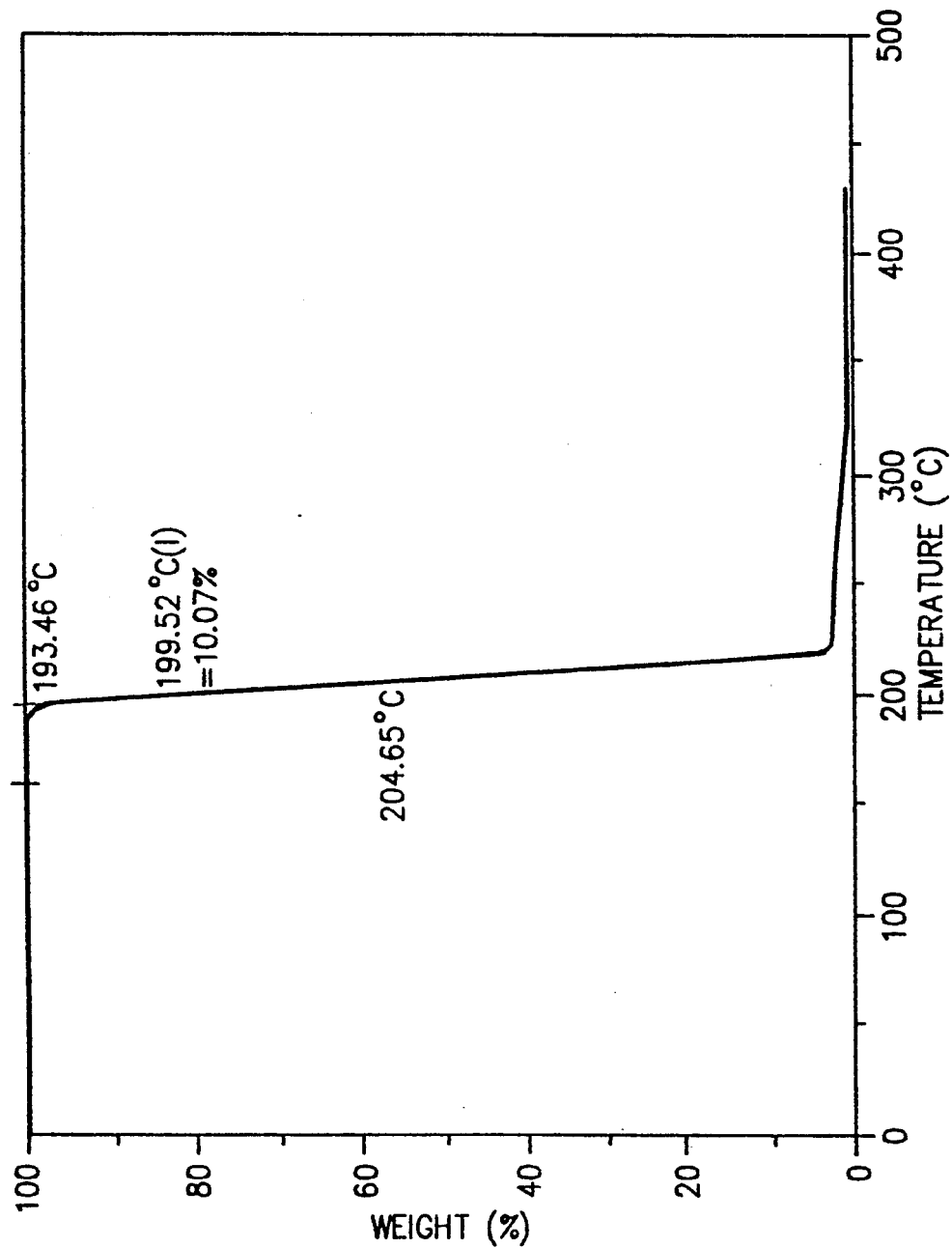
FIG. 3 is a graphical depiction of the unzipping temperature of poly(ethylene carbonate).
Figure 4:
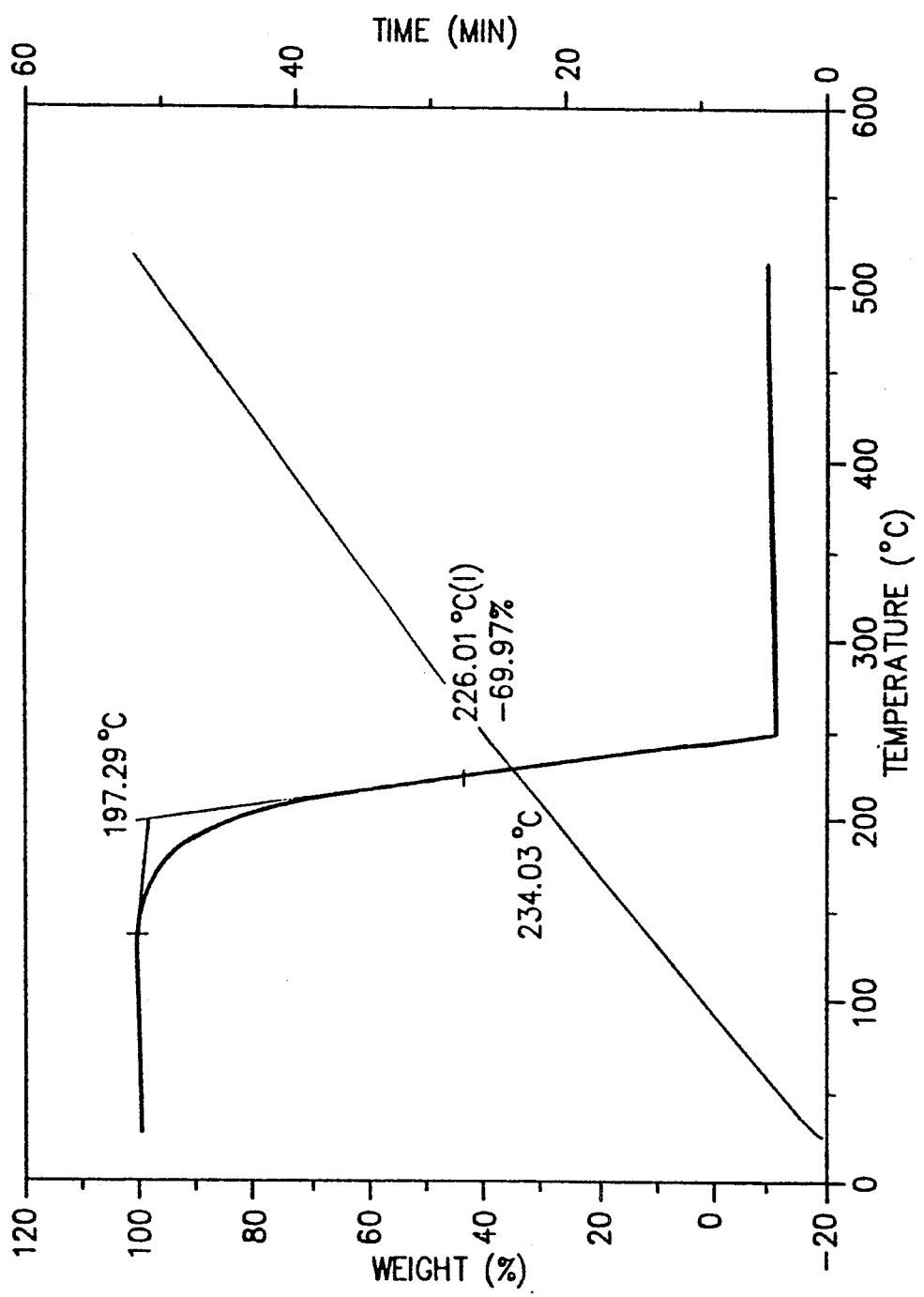
FIG. 4 is a graphical illustration of the vaporization of the UV absorbing dye, Tinuvin 328 (Ciba Geigy).

In the context of the present invention, "depolymerizable polymer" and "unzippable polymer" are referring to the same class of polymers. Currently preferred unzippable polymers include poly(methyl methacrylate) (PMMA), $T_{unzipping} \geq 400°$ C.; poly ($\alpha$-methylstyrene) (P$\alpha$MS), $T_{unzipping} \geq 340°$ C., see FIG. 1; poly(olefinic carbonates) including poly(propylene carbonate) (PPC, $T_{unzipping} = 240°$ C., see FIG. 2; and poly(ethylene carbonate) (PEC) $T_{unzipping} \geq 200°$ C., see FIG. 3, poly(phenyl carbonate) and their copolymers, polycholorals and the like.

The molecular weight of the unzippable polymers of the present invention is typically on the order of between about 20,000 to about 300,000, depending upon spin coating, solvent solubility and unzipping behavior. Molecular weights are not, however, unduly limited, since the primary consideration in selecting a suitable unzippable polymer is the ability of said polymer to depolymerize cleanly at the point or plane of adhesion to substrate. As one skilled in the art will readily discern, at lower molecular weights, the polymer will unzip or depolymerize at a faster rate, the solubility in solvent will improve, but the spin coating characteristics may be adversely affected and the polymer will be more prone to solvent attack from solvent containing coating paste. Unless otherwise indicated, all molecular weights expressed herein are average molecular weights.

Typically, the thermally depolymerizable polymer is dissolved in an organic solvent which permits uniform and easy coating of the thermally depolymerizable polymer. For example, hydrocarbon solvents such as toluene, xylene and which will readily dissolve poly-α-methylstyrene and similar aromatic substituted polymers, and permit uniform coating. Generally a polar solvent such as N-methyl pyrrolidone (NMP), benzyl alcohol and/or acetophenone is required to dissolve poly-methylmethacrylate for spin coating.

The thermally depolymerizable polymer can be spin coated as a viscous polymer solution which permits uniform and efficient coating, as will be appreciated by one skilled in the art. We have found that, typically, thermally depolymerizable polymer percentages in solution on the order of about 10 to about 35, more preferably from 20 to 30, are easily worked with. Weight basis is polymer weight based on total solution weight. Typical organic solvents such as NMP, acetophenone, diglyme, (2-methoxyethylether), etc., are used in conventional coating methods such as solution casting or spin coating methods.

A UV absorbing dye such as Tinuvin 328, which is soluble in NMP and other organic solvents, is necessarily employed with unzippable polymers, such as poly-(olefin) carbonates, that are not readily ablatable by excimer lasers emitting radiation in the UV range. The preferred quantity of this dye is between about 4 to about 8% by weight based on polymer. On laser ablation the dye sublimes with the polymer to form a clean pattern. During unzipping operation the dye vaporizes with the polymer mask.

The unzippable polymer compositions must fulfill a number of physical-property-dependent requirements under practical process conditions. The polymers must form homogeneous solutions in ecologically acceptable solvents; form smooth, flow-free coatings with reasonable adhesion to the chosen substrate; be characterized by good solution stability during storage; form tack-free coatings; resist flow or creep during the screening step; form laser ablatable patterns that do not flow; and be removable after the required fabrication steps. The preceding requirements are dependent upon optimizing the polymer or copolymer composition for unzipping characteristics and solvent solubility, the incorporation of a small quantity of a UV absorbing dye for laser ablating a previously non-ablatable polymer and the solvent content and molecular weight of the polymer for coating characteristics.

If desired, mixtures of thermally depolymerizable polymers and/or mixtures of solvents can be used, though using mixtures of solvents may complicate drying. However, certain advantages can be encountered upon the use of such polymer systems such as improved solubilization of polymer mixtures of different polarity. In those instances where potentially one might find adhesion between the depolymerizable polymer and a layer thereunder or thereover insufficient for some processing step, an adhesion promoter can be used.

Once the unzippable polymer is coated onto the substrate, it is laser ablated to form the desired mask or pattern. The following ablation conditions are preferably applied:

PPMA—laser ablation for 248 nm at fluences from 0.5 to 2 J/CM$^2$ (3 ns pulse).

PαMS—laser ablation from 248 nm at fluences from 0.5 to 2 J/CM$^2$ (30 ns pulse).

95% PPC/5% T-328—laser ablation for 248 nm at fluences from 1 to 2 J/CM$^2$ (30 ns pulse).

95% PEC/5% T-328—laser ablatable at conditions consistent with those employed with the PPC system.

Following ablation of the unzippable polymer into the desired pattern or mask, the desired paste, for e.g., a conductive or resistive paste, is screened through the ablated features of the unzippable polymer, onto the substrate. Some of the potential pastes applicable in the process include solder pastes with flux (alpha-flux, glycol, other acids, etc.), all metal pastes and polymer based ceramic or metal pastes.

The depolymerization and dry lift-off of paste debris step of the present invention involves heating the substrate to induce depolymerization of the polymer layer (commonly referred to herein as the unzipping temperature or $T_{unzipping}$) while the sample sits on a heat source. A typical heat source is a ¼" thick quartz sled. Other heat sources, such as a laser, can be used to heat the depolymerizable polymer.

In those instances where the rapidity of depolymerization can be assisted by irradiation, an appropriate radiation source could be used in combination with an appropriate heating source, for example, where the depolymerizable polymer is depolymerized by electron beams, such could be used in combination with a different conventional heating source. Typically, heating is in an inert gas atmosphere, such as nitrogen, argon, etc., at a temperature sufficient to depolymerize the depolymerizable polymer. The chosen heat source(s) must not adversely effect the properties of the paste and/or substrate materials during depolymerization.

Usually, heating is at a temperature of from about 200° C. to about 400° C. for a period of time of from about 5 minutes to about 30 minutes. Generally, at higher temperatures shorter times will be used and at lower temperatures longer times will be employed. In many instances, heating at from 300° C. to 320° C. for about 10 to 15 minutes will be sufficient.

After heating to the desired temperature and effecting depolymerization of the depolymerizable polymer layer, and vaporization of UV dye, if employed, the device is withdrawn from the heating zone whereupon the cooling thereof and the heating of the sub-layers thereunder breaks up the polymer and frees it from the substrate leaving behind the desired pattern of paste on the substrate. A conventional dry cleaning process such as blow dry, electrostatic cleaning, etc. may be employed to remove the paste debris.

Various cooling means can be used, e.g., air cooling, cooling with pressurized fluorocarbons, e.g., Freon, etc. It should be noted that, a convection cooling process will also simultaneously remove paste debris.

Having generally described the process of the present invention, the following non-limiting example is offered for illustrative purposes.

EXAMPLE 1

Figure 5A:
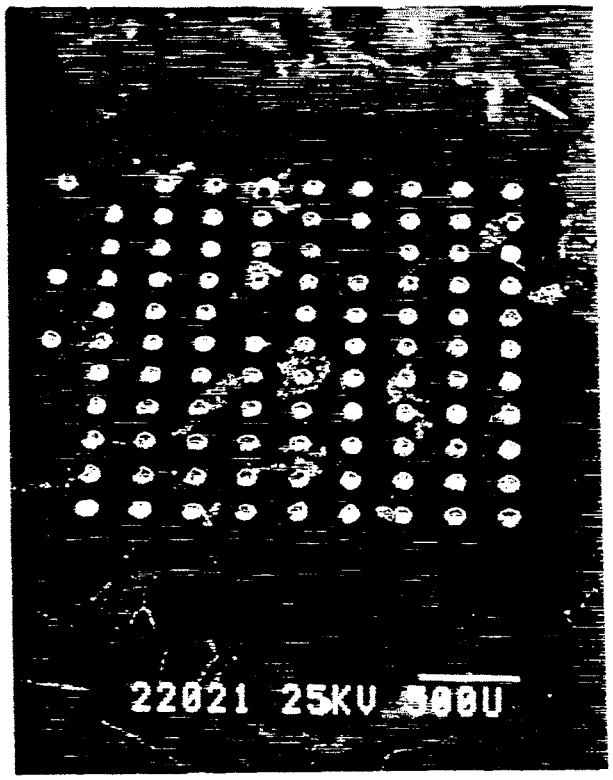
FIG. 5 shows a scanning electron microscope (SEM) photomicrograph of a typical resultant pattern obtained from the method of the present invention.
Figure 5B:
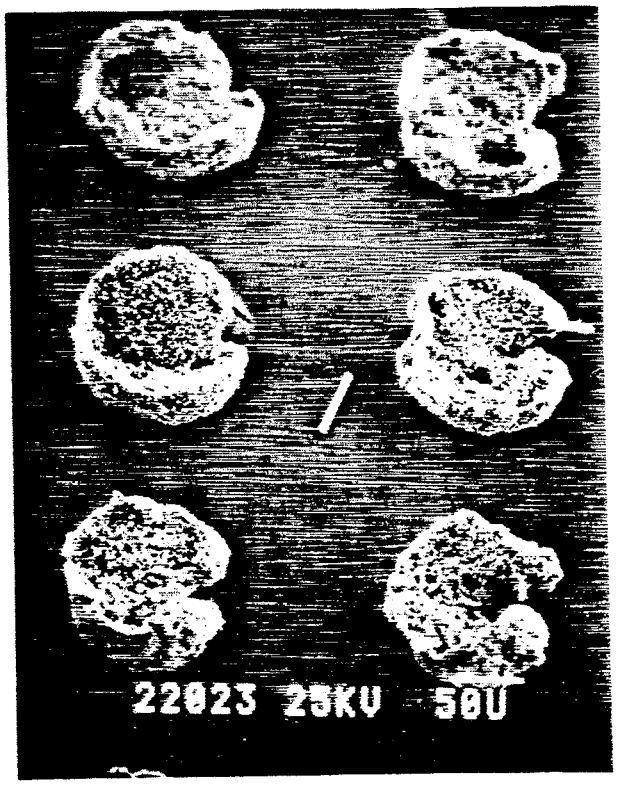
Figure 5C:
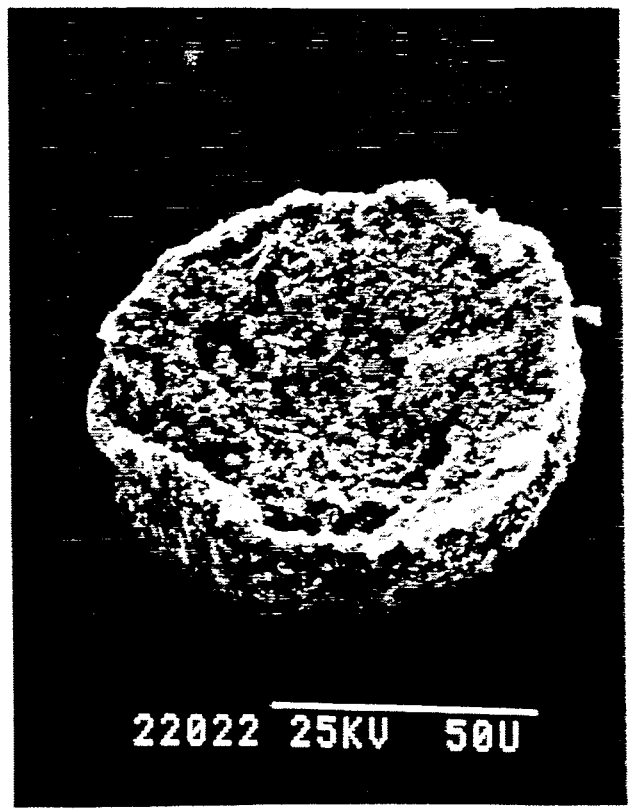

A 30 μ PαMS film was solution cast in NMP at 100° C. for 10 minutes. The film was then ablated with an excimer laser, 248 nm, at a fluence of 0.8 J/CM$^2$, 400 shots at 10 Hz to make 4 mil diameter holes on 8 mil centers. Silver filled poly(imide siloxane) paste (P36A made by M & T), in Diglyme (BP=162° C.) was then screened on the ablated mask in one pass, followed by one pass to clean off the excess paste. The paste was dried at 100° C. for 30 minutes. Unzipping was conducted at 350° C. for ten (10) minutes. FIG. 5 depicts a scanning electron photomicrograph (SEM) of a typical resultant pattern.

Having thus described the invention, what is claimed as new, and is desired to be secured by Letters Patent is:

1. A process for forming a pattern on a substrate comprising:
    (a) laser ablating a polymer film coated on a substrate, said film comprising at least one thermally unzippable polymer, to form the desired pattern or mask;
    (b) screening a conductive or resistive paste through the ablated features of the mask and onto the substrate;
    (c) heating the substrate/polymer mask to a temperature effective to substantially eliminate the adhesion between said mask and said substrate; and
    (d) removing said polymer mask leaving behind the conductive or resistive solid of said paste adhered to the substrate in the desired pattern.

2. The process of claim 1 wherein the unzippable polymer is selected from the group consisting of poly(methyl methacrylate); poly (α-methylstyrene); poly(propylene carbonate), poly(ethylene carbonate), poly(phenyl carbonate) and their copolymers; and polychloral.

3. The process of claim 1 wherein the unzippable polymer film is coated on the substrate by spin coating or solution casting techniques.

4. The process of claim 1 wherein the unzippable polymer is converted to the corresponding gaseous monomer(s) upon heating to the depolymerization temperature.

5. The process of claim 1 wherein the substrate is heated to a temperature insufficient to depolymerize the unzippable polymer, but sufficient to dry the applied paste and to cause the residual solvent and other volatile materials to be removed from the unzippable polymer.

6. The process of claim 1 wherein said substrate is a semiconductor substrate.

7. The process of claim 1 wherein said substrate is an alumina-ceramic substrate.

8. The process of claim 1 wherein said substrate is a glass-ceramic substrate.

9. The process according to claim 1 wherein said heating step is performed in an inert gas atmosphere.

10. The process of claim 9 wherein said inert gas atmosphere is selected from the group consisting of nitrogen and argon.

11. The process of claim 1 wherein a UV absorbing dye is admixed with said unzippable polymer, if said polymer is transparent to UV radiation, which results in an ablatable dye/polymer complex.

12. The process of claim 11 wherein said UV absorbing dye absorbs UV radiation in the frequency employed during ablation and vaporizes at a temperature equal to or below the $T_{unzipping}$ of the unzippable polymer.

13. The process of claim 12 wherein said UV absorbing dye is Tinuvin-328.

14. The process of claim 11 wherein said unzippable polymer is chosen from poly (propylene carbonate), poly(ethylene carbonate), poly(phenyl carbonate) and their copolymers.

15. A process for forming a desired pattern on a substrate comprising:
    (a) admixing a UV absorbing dye with at least one unzippable polymer, said polymer(s) being transparent to UV radiation, to form an unzippable ablatable complex;
    (b) coating said ablatable complex on a substrate to form an unzippable, ablatable film;
    (c) laser ablating said film to form the desired pattern or mask;
    (d) screening a conductive or resistive paste through the ablated features of the mask onto the substrate;
    (e) heating the substrate to a temperature effective to depolymerize the unzippable polymer and vaporize the UV absorbing dye leaving behind the conductive or resistive solid of said paste adhered to the substrate in the desired pattern.

16. The process of claim 15 wherein the UV absorbing dye Tinuvin-328 is admixed with at least one unzippable polymer selected from the group consisting of poly(propylene carbonate), poly(ethylene carbonate), poly(phenyl carbonate) and their copolymers.

17. The process of claim 16 wherein 5 to about 8 weight % of Tinuvin-328, based on unzippable polymer, is employed.

18. The process of claim 15 wherein said UV absorbing dye is Tinuvin-328 and said unzippable polymer is at least one poly(olefinic carbonate), said UV absorbing dye and unzippable polymer being admixed to form an unzippable complex ablatable by a 248 nm excimer laser.

* * * * *